United States Patent [19]

Aschwanden

[11] Patent Number: 4,528,527
[45] Date of Patent: Jul. 9, 1985

[54] SECAM MODULATOR

[75] Inventor: Felix Aschwanden, Thalwil, Switzerland

[73] Assignee: RCA Corporation, Princeton, N.J.

[21] Appl. No.: 394,886

[22] Filed: Jul. 2, 1982

[30] Foreign Application Priority Data

Mar. 8, 1982 [GB] United Kingdom ............... 8206779

[51] Int. Cl.³ ............................................ H03C 3/00
[52] U.S. Cl. ...................................... 332/19; 331/17;
331/34; 455/113
[58] Field of Search .................. 331/14, 15, 17, 175,
331/10, 34; 332/18, 19, 30 V; 358/14, 23;
455/110, 113

[56] References Cited

U.S. PATENT DOCUMENTS

| 3,579,281 | 5/1971 | Kam et al. | 331/10 |
| 4,107,624 | 8/1978 | Turner | 331/10 X |
| 4,336,508 | 6/1982 | Cole et al. | 331/34 |

FOREIGN PATENT DOCUMENTS

| 39446 | 3/1980 | Japan | 331/17 |
| 2050105 | 12/1980 | United Kingdom | 358/14 |

Primary Examiner—Eugene R. LaRoche
Assistant Examiner—Robert J. Pascal
Attorney, Agent, or Firm—Eugene M. Whitacre; Paul J. Rasmussen; William H. Meagher

[57] ABSTRACT

A SECAM modulator has a frequency control loop for maintaining constant average frequency of a VCO during a scanning line. However, this can cause varying deviation of the VCO. Therefore a second control loop is provided to control the voltage of the VCO to maintain constant voltage-to-frequency gain.

7 Claims, 5 Drawing Figures

SECAM MODULATOR

BACKGROUND OF THE INVENTION

The present invention relates to stabilizing the gain (voltage to frequency) of a voltage controlled oscillator (VCO) against temperature changes so as to maintain stable deviation, in particular for use in a SECAM modulator.

The gain of most prior art VCOs varies with temperature. In an application such as a SECAM modulator, this variation is undesirable since then the deviation of the VCO having a SECAM modulating signal of given amplitude will in turn vary. This problem is especially acute in ENG (electronic news gathering) cameras, which cameras must be able to operate in environments having temperature ranges in excess of $-20°$ C. to $+40°$ C.

A gain control loop for SECAM encoders is shown in U.S. Pat. No. 4,264,918. The circuit shown therein works very accurately and is well suited for sophisticated studio applications. However, it may have a high component count and may require considerable space and power, which may render it unsuitable for ENG cameras.

It is therefore desirable to provide a VCO that has stable gain and low power and component requirements.

SUMMARY OF THE INVENTION

Method and apparatus for controlling the voltage-to-frequency gain of a voltage controlled oscillator, comprising controlling the average frequency of the output signal from said oscillator, comparing the average modulating voltage of said oscillator with a reference voltage to generate a difference voltage, and controlling a supply voltage for said oscillator in accordance with said different voltage to maintain constant deviation.

DETAILED DESCRIPTION

Figure 1:
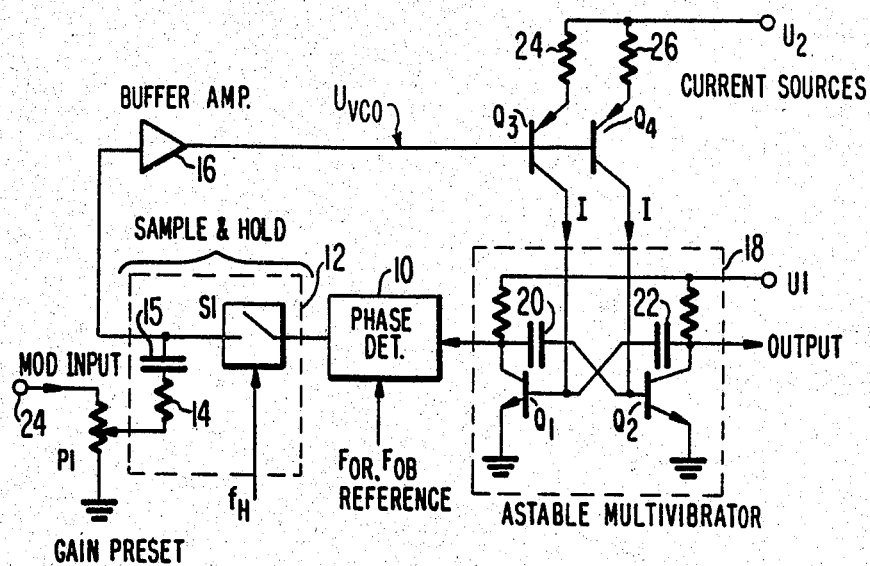
FIG. 1 shows a prior art VCO circuit.

FIG. 1 shows a VCO circuit designed especially for SECAM encoders. It comprises an astable multivibrator 18 having transistors $Q_1$ and $Q_2$ and capacitors 20 and 22. Multivibrator 18 is frequency controlled by means of two transistors $Q_3$ and $Q_4$ operating as identical voltage to current converters, which converters produce currents I from the collectors of transistors $Q_3$ and $Q_4$. The frequency of the VCO is locked to one of the two SECAM reference frequency signals $F_{OR}$ and $F_{OB}$ on alternate lines during horizontal blanking by means of phase detector 10, which line alternately receives said reference signals from a source (not shown) and generates an error signal, and sample and hold circuit 12 having switch S1, which switch receives a horizontal synch signal $f_H$ as a control signal in order to sample the error signal when the chroma signal is not present. The chroma modulation signal is received at input 24 and is added to the sampled error signal from sample and hold circuit 12 by way of a gain preset potentiometer P1, and a series resistor 14 and a D.C. blocking capacitor 15 and is fed to high input impedance buffer amplifier 16. The output voltage $U_{VCO}$ of amplifier 16 controls the frequency F of the VCO.

F is given by:

$$F = K \cdot \frac{I}{C \cdot U_1}, \quad (1)$$

wherein K is a factor depending on temperature varying parameters of transistors $Q_1$ and $Q_2$ ($U_{BE}$, $U_{CE}$, etc.), $U_1$ is the supply voltage of transistors $Q_1$ and $Q_2$, and C is the capacitance of each of the capacitors 20 and 22, which capacitors are equal in value. It can be seen from equation 1 that F is proportional to I and that F becomes zero for I=zero. The current I of the voltage to current converters comprising transistors $Q_3$ and $Q_4$ is given by:

$$I = \frac{U_2 - U_{VCO}}{R}, \quad (2)$$

wherein $U_2$ is the supply voltage of transistors $Q_3$ and $Q_4$, and R is the resistance of resistors 24 and 26. The $U_{BE}$ (base-emitter) drops of transistors $Q_2$ and $Q_3$ have been neglected in equation 2. Equation 1 can now be rewritten as:

$$F = \frac{(U_2 - U_{VO})}{R} \cdot \frac{K}{C \cdot U_1}. \quad (3)$$

Figure 2:
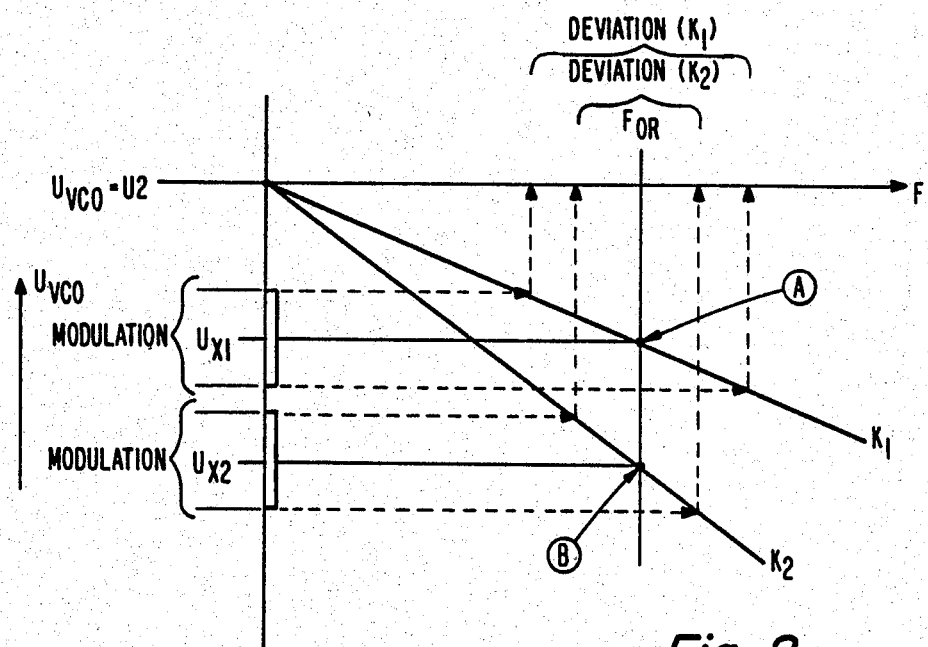
FIG. 2 is a graph showing the operation of FIG. 1.

FIG. 2 shows a graph of the voltage to frequency characteristic of the VCO for two different values of K ($K_1$ and $K_2$). It can be seen that F becomes zero for $U_{VCO}=U_2$, e.g. when I=0. FIG. 2 further shows that the center frequency of the VCO (for instance $F_{OR}$ on alternate lines) remains constant due to the action of phase detector 10 and sample and hold circuit 12. Therefore the average modulation voltage $U_X$ changes from $U_{X1}$ for $K_1$ having the operating point A to $U_{X2}$ for $K_2$ having the operating point B in order to maintain constant average frequency, assuming a constant modulation signal amplitude. This in turn causes a change in the deviation for a constant amplitude modulating signal due to the different slopes for different values of K. This is undesirable. In order to keep the deviation constant the modulation signal amplitude could be changed, as has been done in Pat. No. 4,264,918, or the slope of the voltage to frequency characteristic must be held constant. This is possible if the factor $$\frac{K}{C \cdot U_1} \text{ (in equation 3)}$$

is kept constant.

As mentioned above, K depends on transistors $Q_1$ and $Q_2$, and therefore an ambient temperature. Also the value of C changes with temperature in accordance with the temperature coefficient of capacitors 20 and 22. This leaves $U_1$ to be controlled in order to keep the factor K constant. If $U_1$ is so controlled, the operating point in FIG. 2 is kept stable at point A, i.e. does not shift from A to B, since $F_{OR}$ (or $F_{OB}$ on alternate lines) together with $U_X$ define the operating point A in FIG. 2 and the change in the value of $U_1$ compensates for the change in the value of K, thereby keeping the modulation gain about point A constant. This solution is much simpler to realize than the prior-art arrangement and will be explained below.

Figure 3:
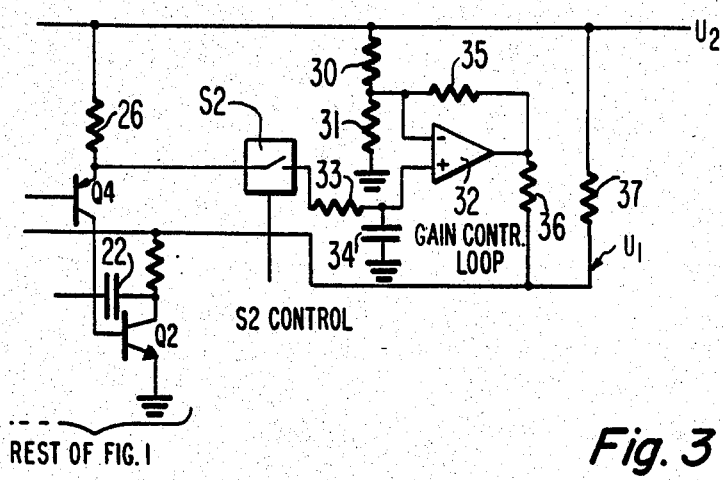
FIG. 3 is a circuit in accordance with the invention that is to be added to the circuit of FIG. 1.

FIG. 3 shows the control loop to be added to the circuit of FIG. 1. The operation is as follows. A reference voltage, which is provided by the voltage divider comprising resistors 30 and 31 is applied to the negative (inverting) input of amplifier 32. This reference voltage is known in advance and is substantially the same from assembly to assembly. Generally speaking, the reference voltage is equal to the nominal value of $U_X$ measured at the emitter of $Q_4$. The voltage $U_X$ is present at the emitter of transistor $Q_4$ due to the fact that amplifier 16 is coupled to the base thereof, neglecting the base-emitter voltage drop of transistor $Q_4$. This voltage $U_X$ is sampled by sampling switch $S_2$ (whose control signal is described below) and applied to the positive (non-inverting) input of operational amplifier 32 by a low pass and hold circuit comprising resistor 33 and capacitor 34. The closed loop gain of amplifier 32 is set by means of negative feedback resistor 35. $U_1$ is obtained at the output of amplifier 32 by means of a resistor adder network 36 and 37 and due to said negative feedback changes until both input voltages ($U_X$ and the reference voltage) to amplifier 32 are equal in amplitude. Thus $U_X$ is held to a constant value (the reference voltage), and therefore the deviation is constant and can be set to a desired value by potentiometer P1.

Figure 4:
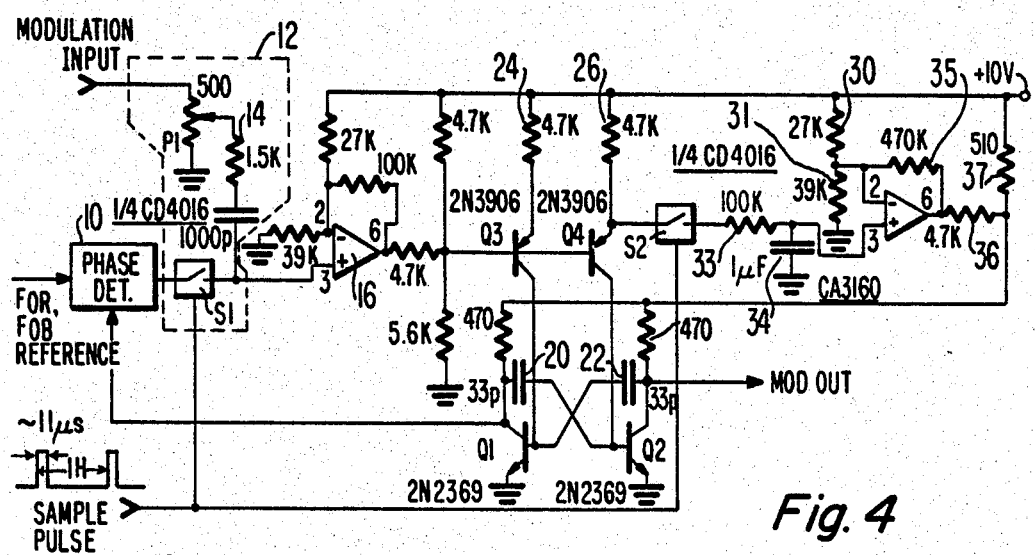
FIG. 4 is a detailed schematic diagram of the invention.
Figure 5:
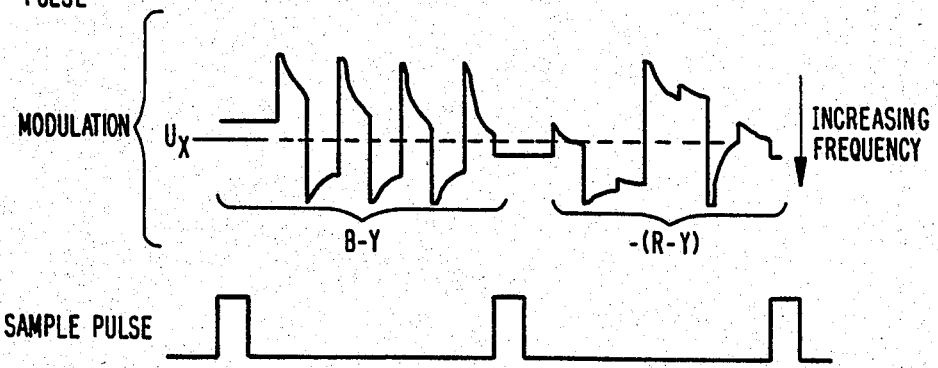
FIG. 5 shows waveforms existing in the circuit of FIG. 4.

It should be mentioned that the frequency control loop of FIG. 1 comprising phase detector 10 and sample and hold circuit 12 is still required. No interaction between the two loops has been observed as their respective time constants are different. The frequency control loop is very fast (microseconds), while the gain control loop can be made very slow (seconds) by means of large values for resistor 33 and capacitor 34. As mentioned earlier, the VCO will be locked to one of the two reference frequencies during horizontal blanking, and therefore the control signal for switch S1 of FIG. 1 is the horizontal blanking signal. The same signal can also be used to control switch S2 of FIG. 3 of the gain control loop. Only a few extra components are needed. The complete circuit is shown in FIG. 4, while FIG. 5 shows the modulation signal $U_{VCO}$ at the emitter of the current source transistor $Q_4$.

What is claimed is:

1. A method for controlling the voltage-to-frequency gain of a voltage controlled oscillator, said method comprising controlling the frequency of the output signal from said oscillator in a degenerative feedback manner producing a loop error voltage suitable for effecting synchronization of said output signal frequency with a reference signal frequency during recurring control intervals, superimposing a modulating voltage upon said loop error voltage to produce the frequency control voltage of said oscillator, comparing the average frequency control voltage exhibited during said recurring control intervals with a reference voltage to generate a difference voltage, and controlling a supply voltage for said oscillator in accordance with said difference voltage to maintain said voltage-to-frequency gain substantially constant.

2. Apparatus for controlling the voltage-to-frequency gain of a voltage controlled oscillator, said apparatus comprising:
a reference voltage frequency source;
first degenerative feedback controlling means coupled to said voltage controlled oscillator and to said reference frequency source for generating a loop error voltage for controlling the frequency of the output signal from said oscillator to effect synchronization of said output signal frequency with a reference signal frequency during recurring control intervals;
coupling means coupled to said first controlling means for superimposing a modulating voltage on said loop error voltage to produce a frequency control voltage for said oscillator;
a reference voltage source;
comparing means coupled to said first controlling means and to said reference voltage source for comparing the average frequency control voltage exhibited during said recurring control intervals with said reference voltage to generate a difference voltage; and
second controlling means coupled to said oscillator and to said comparing means for controlling a supply voltage to said oscillator in response to said difference voltage to maintain said voltage-to-frequency gain substantially constant.

3. Apparatus as claimed in claim 1, wherein said comparing means comprises a difference amplifier.

4. Apparatus as claimed in claim 2, wherein said second controlling means comprises adding means for adding a fixed voltage and said difference voltage.

5. Apparatus as claimed in claim 2, wherein each of said controlling means comprises a sampling means, each of said sampling means receiving a horizontal synchronization pulse for control of said sampling means, and said modulating voltage is a SECAM modulating signal.

6. Apparatus for controlling the voltage-to-frequency gain of a voltage-controlled oscillator including first and second frequency controlling input terminals and an oscillator output terminal, said apparatus comprising:
a source of reference-frequency signals;
a phase-lock loop coupled to the oscillator output terminal of said voltage-controlled oscillator including means for comparing the oscillator output signals with said reference-frequency signals for generating a loop error voltage suitable for controlling the frequency of said voltage-controlled oscillator in a manner effecting synchronization of said oscillator output signals with said reference-frequency signals during recurring control intervals;
modulation means coupled to said phase-lock-loop for superimposing a modulating voltage upon said loop error voltage to produce a first frequency control signal connected to said first frequency controlling terminal;
a source of reference voltage;
second frequency control signal generating means coupled to said phase-lock loop and to said source of reference voltage for taking the difference between the average of the first frequency control signals exhibited during said recurring control intervals and said reference voltage for generating a second frequency control signal; and
coupling means coupled to said second frequency control signal generating means and to said second frequency controlling input terminal of said voltage controlled oscillator for coupling said second frequency control signal to said voltage controlled oscillator.

7. Apparatus according to claim 6 wherein said modulating voltage is a television video signal including blanking and active intervals, and said phase-lock loop comprises a phase-detector coupled to said source of reference-frequency signals and to said oscillator output terminal for continuously generating a phase comparison signal, and said phase-lock loop further comprises sample-and-hold means coupled to said phase-detector for sampling said phase comparison signal during said blanking intervals for generating said loop error voltage.

* * * * *

UNITED STATES PATENT AND TRADEMARK OFFICE
CERTIFICATE OF CORRECTION

PATENT NO. : 4,528,527
DATED : July 7, 1985
INVENTOR(S) : Felix Aschwanden

It is certified that error appears in the above-identified patent and that said Letters Patent is hereby corrected as shown below:

Column 4, line 26, the portion reading "claim 1" should read -- claim 2 --.

Signed and Sealed this

Tenth Day of December 1985

[SEAL]

Attest:

DONALD J. QUIGG

Attesting Officer

Commissioner of Patents and Trademarks